May 26, 1959 M. HETZEL 2,888,582

TUNING FORK OSCILLATOR

Filed Feb. 14, 1956

Inventor:
Max Hetzel
By: Michael S. Striker
agt.

2,888,582

TUNING FORK OSCILLATOR

Max Hetzel, Biel, Switzerland, assignor to Bulova Watch Company, Inc., New York, Biel, Switzerland Application February 14, 1956, Serial No. 565,451

7 Claims. (Cl. 310—25)

The present invention relates to tuning fork oscillators.

More particularly, the present invention relates to tuning fork oscillators adapted to be used in timepieces. Such tuning fork oscillators are required to oscillate at a constant frequency so that accurate time may be obtained from such oscillators when they are used to operate a timepiece. When such tuning fork oscillators are used in a timepiece, for example, it is undesirable to have too much energy absorbed by the structure which carries the tuning fork since too much energy will then be required to vibrate the tuning fork itself, but with conventional arrangements a considerable amount of energy is absorbed by the structure which carries the tuning fork and also it is difficult to maintain an absolutely constant frequency of oscillation.

One of the objects of the present invention is to provide a tuning fork oscillator which will oscillate without causing an undesirably large amount of energy to be absorbed by the structure which carries the tuning fork oscillator.

Another object of the present invention is to provide a tuning fork oscillator capable of vibrating at a constant frequency.

A further object of the present invention is to provide a tuning fork oscillator which will be capable of oscillating to the desired extent even though it is carried by a relatively massive structure which would tend to absorb an undesirably large part of the energy of the vibrating tuning fork.

An additional object of the present invention is to provide a means for mounting a tuning fork in a manner capable of withstanding a relatively large shock.

Also, it is an object of the present invention to provide a tuning fork oscillator and mounting means therefor capable of accomplishing the above objects and at the same time composed of simple and ruggedly constructed elements capable of reliably operating for a long period of time.

With the above objects in view, the present invention mainly consists of a tuning fork oscillator which includes a tuning fork having a pair of tines between which an axis of symmetry on the tuning fork is located. The tines respectively have free end portions and opposite ends respectively located distant from the free end portions and interconnected by a connecting portion of the tuning fork. At least one magnetic drum is carried by the free end portion of one of the tines and has a center of gravity spaced from the axis of symmetry by a distance which is at least as small as the distance between the opposite end of the tine carrying the magnetic drum and the axis of symmetry. In this way the projection of the path of movement of the center of gravity of the drum onto the axis of symmetry is maintained at a minimum.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings, in which:

Fig. 1 is a partly diagrammatic elevational view of a conventional tuning fork oscillator arrangement;

Fig. 2*a* is an elevational view of a tuning fork oscillator arrangement according to the present invention;

Fig. 2*b* is a fragmentary, partly sectional, side view of the structure of Fig. 2*a*;

Figure 1:
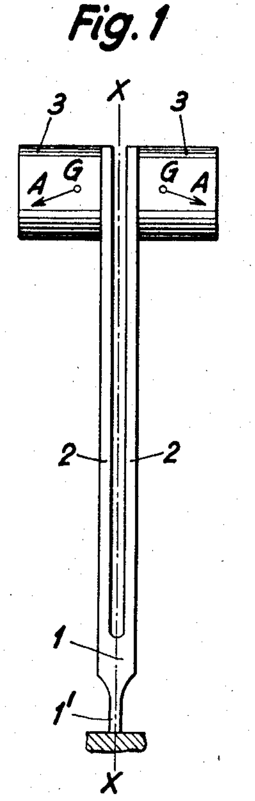

Fig. 1 shows a conventional tuning fork oscillator arrangement. As may be seen from Fig. 1 the tuning fork includes a pair of tines 2 interconnected by a connecting portion 1 which is fixed at 1' to a base of any suitable construction. At the free ends of the tines 2 a pair of magnetic drums 3 are respectively fixed as by soldering, for example, in the positions indicated in Fig. 1. As is apparent from Fig. 1, the tuning fork arrangement illustrated has an axis of symmetry X—X. Because this conventional tuning fork arrangement has the relatively heavy magnetic drums 3 carried in the illustrated manner by the free end portions of the tines 2, the centers of gravity of the drums 3 which move respectively in the direction of arrows A during oscillation produce appreciable vertical components parallel to the axis of symmetry X—X, and thus the paths of movement of the centers of gravity G of the drums 3 provide on the axis of symmetry projections of the paths of movement which are of appreciable length. As a result appreciable vibrations are transmitted to the base which carries the tuning fork and the vibration of the base damps the oscillations of the tuning fork, the base itself absorbing a considerable amount of energy in an undesirable manner since all the more energy is required to maintain the oscillations of the tuning fork.

Figure 2A:
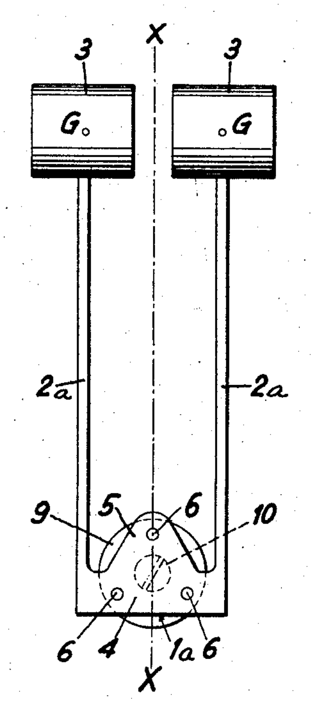

One embodiment of a tuning fork oscillator according to the present invention is shown in Fig. 2*a* from where it will be seen that the tuning fork includes a pair of tines 2*a* between which is located the axis of symmetry X—X. The tines 2*a* are interconnected by the connection portion 1*a* provided with a central enlarged portion 5 of substantially triangular shape. The portion 4 of the connecting portion 1*a* is elongated and substantially rectangular in shape. The tines 2*a* are parallel to each other and carry at their free ends the magnetic drums 3, which may be identical with the magnetic drums of Fig. 1, and which have the centers of gravity G located as indicated in Fig. 2*a*. Thus, these centers of gravity are respectively located along projections of the tines 2*a*. Thus, it will be seen that with the arrangement of Fig. 2*a* the centers of gravity are located at distances from the axis of symmetry X—X equal to the distances of the ends of the tines 2*a* fixed to the connection portion 4 from the axis of symmetry. The lengths and widths of the tines 2*a* are chosen so that the oscillations have the smallest possible amplitude to provide the best possible frequency constant, and it will be seen that with the arrangement of Fig. 2*a* the projections of the paths of movement of the centers of gravity G onto the axis X—X are so small as to be negligible.

Figures 2B, 5:
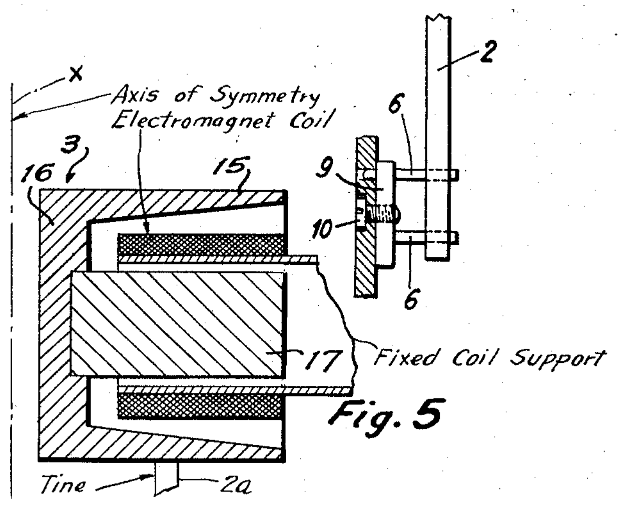
Fig. 5 is a sectional view on an enlarged scale of a magnetic drum which forms part of the tuning fork oscillator of the present invention.

Three pins 6 respectively located at the corners of an equilateral triangle are fixed to the connecting portion 1*a* at the parts 4 and 5 thereof in the manner shown in Figs. 2*a* and 2*b* with the axis of symmetry X—X passing through one of the pins 6 and located equidistant from the other two pins 6. These pins all extend in the same direction from a face of the tuning fork, as is evident from Fig. 2*b*, and the pins are connected to a plate 9 which is parallel to and spaced from the tuning fork in the manner shown in Fig. 2*b*, this plate 9 being circular, as shown in Fig. 2*a*. The pins 6 extend through and beyond the plate 9, these pins 6 having press fits in the bores of the plate 9, and the pins 6 extend into suitable bores of the carrier plate shown in section in Fig. 2*b*. Furthermore the plate 9 is provided with a threaded bore which receives a screw 10 which fixes the plate 9 to the carrier plate in the manner shown in Fig. 2*b* so that in this way the tuning fork is mounted on a suitable carrier structure. Because of this arrangement the pins 6 give a certain resiliency to the mounting of the tuning fork so that even if the carrying structure of the tuning fork is quite massive with respect to the tuning fork it will never be possible for sufficient energy to be absorbed to prevent the desired oscillation of the tuning fork. Because of the dimensions of the tuning fork of Fig. 2*a* and the arrangement of the magnetic drums 3 thereon it is possible to obtain oscillations of constant frequency requiring almost a negligible amount of energy.

Figure 3:
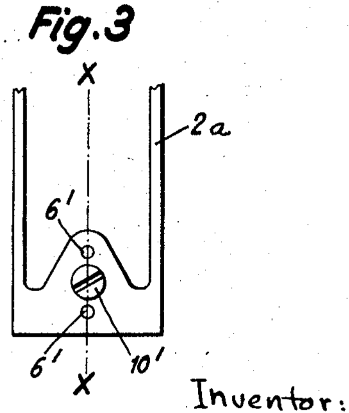
Fig. 3 is a fragmentary elevational view of the bottom end portion of a different embodiment of a tuning fork mounting arrangement according to the present invention.

It is possible to simplify the mounting structure described above by eliminating the plate 9 and one of the pins 6. Such an arrangement is shown in Fig. 3 where a screw 10′ corresponding to the screw 10 is carried by the connecting portion of the tuning fork itself, and a pair of pins 6′ located along the axis of symmetry X—X replace the three pins 6 of Figs. 2*a* and 2*b*. These pins 6′ of Fig. 3 extend into suitable openings of the carrier plate and the screw 10′ is threaded to the carrier plate, so that with this arrangement a rigid mounting of the tuning fork on the carrier plate is provided, the pins 6′ preventing any turning of the tuning fork in the plane of oscillation.

Figure 4:
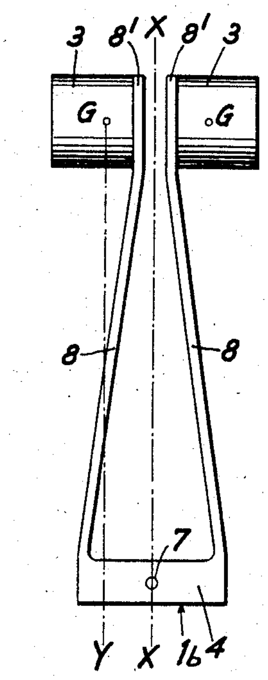
Fig. 4 is an elevational view of another embodiment of a tuning fork oscillator arrangement according to the present invention.

Fig. 4 shows a different embodiment of a tuning fork satisfying the requirements of the present invention. Thus, referring to Fig. 4, it will be seen that the tuning fork includes a pair of tines 8 which are interconnected by a connecting portion **1*b* having the elongated rectangular shape 4 and provided with a bore 7 to receive a screw member such as the screw member 10′ of Fig. 3. Additional bores may be provided along the axis X—X to receive pins similar to pins 6′** to prevent undesired turning of the tuning fork.

The tines 8 of the tuning fork of Fig. 4 are inclined toward each other and converge toward each other as they approach their free ends 8′, so that the tuning fork has the substantially triangular configuration indicated in Fig. 4. The magnetic drums 3 are fixed at end faces thereof respectively to the outer faces of the free end portions 8′ of the tines 8. It will be noted that with this arrangement the centers of gravity are located along axes Y—Y respectively parallel to the axis of symmetry X—X, and furthermore it will be seen from Fig. 4 that the centers of gravity G of the drums 3 are located from the axis X—X respectively by distances which are smaller than the distances between the interconnected ends of the tines 8 and the axis of symmetry X—X. Thus, with this arrangement also a negligible amount of energy will be transmitted to the base. The embodiment of Fig. 4 may have a connecting portion **1*b*** or a connecting portion identical with that of Figs. 2*a* and 2*b* or it may have the connecting portion shown in Fig. 3 to interconnect the tines. With the embodiment of Fig. 4 the frequency of oscillations is maintained constant at a desired value and only a minimum amount of energy is required to maintain the vibrations.

The magnetic drums 3 have the structure indicated in Fig. 5. Thus, referring to Fig. 5 it will be seen that the connecting drums include outer substantially cylindrical members 15 of soft iron provided with an end wall 16, the cylinders 15 tapering from the end wall 16 in the manner shown in Fig. 5. At its center the cylinder 15 has connected to the end wall 16 a core 17 which is substantially cylindrical, which extends along the axis of the cylinder 15, and which is spaced from the cylindrical wall of the cylinder 15 in the manner shown in Fig. 5 to accommodate a coil which is spaced both from the core 17 and the cylinder 15. The core 17 is made of a very hard and very strong magnetic material known under the trade names of Ticonal or Alnico. Such magnetic drums and the wiring diagram of the electrical circuit associated therewith are shown in copending application Serial No. 436,949, filed June 15, 1954, and entitled "Electronic Device for Operation of a Timepiece Movement."

Because of the elasticity of the mounting shown in Figs. 2*a* and 2*b*, the tines **2*a*** need not have precisely the same natural frequencies, and the entire tuning fork itself is capable of oscillating as the result of a shock, for example. However, with the substantially rigid mounting of Fig. 3 any vibration of the tuning fork at the part thereof which interconnects the tines is prevented. Thus, with this arrangement the equality between the natural frequencies of the tines is more important. However, when used in a relatively small device such as a watch the mounting of Fig. 3 is of great practical value because of its simplicity and it is capable of being used even if the natural frequencies of the tines are not precisely equal because the carrying structure of a small device such as a watch is so small with relation to the tuning fork that this carrying structure cannot absorb an undesirably large amount of the vibrations. The resilient mounting of Figs. 2*a* and 2*b* can be used in a small device such as a watch, but this resilient mounting also allows the tuning fork to be universally used on any carrying structure irrespective of how massive it is, because the pins 6 separate the tuning fork from any massive carrying structure and thus guarantee that the tuning fork will operate properly since it will not be possible for too great an amount of energy to be absorbed by the carrying structure, and thus it will not be possible for the damping of the carrying structure to prevent the vibrations.

It will be understood that each of the elements described above, or two or more together, may also find a useful application in other types of tuning fork oscillators differing from the types described above.

While the invention has been illustrated and described as embodied in tuning fork oscillators for timepieces, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be secured by Letters Patent is:

1. In a tuning fork oscillator, in combination, a tuning fork having a pair of parallel tines between which an axis of symmetry of the tuning fork is located, said tines having free end portions, respectively, and opposite ends respectively distant from said free end portions connected by a connecting portion of said tuning fork; and means secured to said connecting portion for supporting said fork, a pair of magnetic drums carried by the free ends of said tines, respectively, a pair of fixedly mounted electromagnetic coils disposed cooperatively with respect to said drums such that movement of either drum in a direction away from said axis effects increased coupling between said drum and the associated coil, said drums having centers of gravity spaced in the static condition of the fork, respectively, from said axis of symmetry by distances respectively equal to the distances between said opposite ends of said tines and said axis of symmetry to minimize the production of components of force parallel to said axis and thereby reduce absorption of energy by said supporting means for the fork.

2. In a tuning fork oscillator, in combination, a tuning fork having a pair of tines between which an axis of symmetry of the tuning fork is located, said tines respectively having free end portions and opposite ends respectively distant from said free end portions connected together by a connecting portion of the tuning fork, said opposite ends of said tines respectively being located on opposite sides of said axis of symmetry at distances therefrom respectively greater than the distances of said free end portions of said tines from said axis of symmetry; means secured to said connecting portion for supporting said fork, a pair of magnetic drums respectively fixed at end faces thereof to said free end portions of said tines a pair of fixedly mounted electromagnetic coils disposed cooperatively with respect to said drums such that movement of either drum in a direction away from said axis effects increased coupling between said drum and the associated coil, said drums having respective centers of gravity located on opposite sides of said axis of symmetry at distances therefrom respectively which in the static condition of the fork are smaller than the distances of said opposite ends of said tines from said axis of symmetry to minimize the production of components of force parallel to said axis and thereby reduce absorption of energy by said supporting means for the fork.

3. In a tuning fork oscillator, in combination, a tuning fork having a pair of tines between which an axis of symmetry of the tuning fork is located, said tines respectively having free end portions and respectively having opposite ends distant from said free end portions interconnected by an elongated connecting portion of the tuning fork provided with a central enlarged section; a magnetic drum carried by the free end portion of one of said tines and having a center of gravity which in the static condition of the fork is spaced from said axis of symmetry by a distance at least as small as the distance between the opposite end of said one tine and said axis of symmetry; means connected to said enlarged section of said connecting portion of said tuning fork for resiliently fixing the tuning fork to a base, and a fixedly mounted electromagnetic coil disposed cooperatively with respect to said drum such that movement of said drum in a direction away from said axis effects increased coupling between said drum and said coil.

4. In a tuning fork oscillator, in combination, a tuning fork having a pair of tines between which an axis of symmetry of the tuning fork is located, said tines having free end portions, respectively, and having opposite ends respectively located distant from said free end portions and interconnected by an elongated portion of the tuning fork, said tines being inclined toward each other and converging toward each other and having a minimum distance between said free end portions thereof and a maximum distance between said opposite ends thereof; a pair of magnetic drums fixed respectively to said free end portions of said tines and having centers of gravity respectively located in the static condition of the fork nearer to said axis of symmetry than said opposite ends of said tines, and a pair of fixedly mounted electromagnetic coils disposed cooperatively with respect to said drums such that movement of either drum in a direction away from said axis effects increased coupling between said drum and the associated coil.

5. In a tuning fork oscillator, in combination, a tuning fork having a pair of tines between which an axis of symmetry of the tuning fork is located, said tines respectively having free end portions and respectively having opposite ends opposite from said free end portions interconnected by a connecting portion of said tuning fork; means secured to said connecting portion for supporting said fork, a magnetic drum fixed to the free end portion of one of said tines, a fixedly mounted electromagnetic coil disposed cooperatively with respect to said drum such that the movement of said drum in a direction away from said axis effects increased coupling between said drum and said coil, said drum having a center of gravity which in the static condition of the fork is spaced from said axis of symmetry by a distance which is at least as small as the distance of said opposite end of said one tine from said axis of symmetry to minimize the production of components of force parallel to said axis, thereby reducing absorption of energy by said supporting means for said fork.

6. In a tuning fork oscillator, in combination, a tuning fork having a pair of tines between which an axis of symmetry of the tuning fork is located, said tines respectively having free end portions and respectively having opposite ends opposite from said free end portions interconnected by a connecting portion of said tuning fork; means secured to said connecting portion for supporting said fork, a magnetic drum fixed to the free end portion of one of said tines, a fixedly mounted electromagnetic coil disposed cooperatively with respect to said drum such that the movement of said drum in a direction away from said axis effects increased coupling between said drum and said coil, said drum having a center of gravity which in the static condition of the fork is spaced from said axis of symmetry by a distance which is substantially equal to the distance of said opposite end of said one tine from said axis of symmetry to minimize the production of components of force parallel to said axis, thereby reducing absorption of energy by said supporting means for said fork.

7. In a tuning fork oscillator, in combination, a tuning fork having a pair of tines between which an axis of symmetry of the tuning fork is located, said tines respectively having free end portions and respectively having opposite ends opposite from said free end portions interconnected by a connecting portion of said tuning fork; means secured to said connecting portion for supporting said fork, a magnetic drum fixed to the free end portion of one of said tines, a fixedly mounted electromagnetic coil disposed cooperatively with respect to said drum such that the movement of said drum in a direction away from said axis effects increased coupling between said drum and said coil, said drum having a center of gravity which in the static condition of the fork is spaced from said axis of symmetry by a distance which is less than the distance of said opposite end of said one tine from said axis of symmetry to minimize the production of components of force parallel to said axis, thereby reducing absorption of energy by said supporting means for said fork.

References Cited in the file of this patent

UNITED STATES PATENTS

| | | |
|---|---|---|
| 395,556 | Field | Jan. 1, 1889 |
| 2,015,410 | Prescott | Sept. 24, 1935 |
| 2,034,787 | Williams | Mar. 24, 1936 |
| 2,152,955 | Coyne | Apr. 4, 1939 |
| 2,247,960 | Michaels | July 1, 1941 |
| 2,532,038 | Sebouh | Nov. 28, 1950 |
| 2,556,342 | Sebouh | June 12, 1951 |